United States Patent [19]

Kudo

[11] Patent Number: 4,641,230
[45] Date of Patent: Feb. 3, 1987

[54] PULSE ABSORPTION CIRCUIT FOR POWER SOURCE CIRCUIT

[75] Inventor: Sinji Kudo, Yokohama, Japan

[73] Assignee: Stanley Electric Co., Ltd., Tokyo, Japan

[21] Appl. No.: 687,638

[22] Filed: Dec. 31, 1984

[51] Int. Cl.[4] .................................................. H02H 7/122
[52] U.S. Cl. ......................................... 363/56; 361/111
[58] Field of Search ........................... 361/56, 91, 111; 363/20, 21, 56

[56] References Cited

U.S. PATENT DOCUMENTS

| 3,828,239 | 8/1974 | Nagai et al. | 363/20 |
| 4,073,003 | 2/1978 | Chambers | 363/20 |
| 4,365,171 | 12/1982 | Archer | 363/20 |
| 4,403,269 | 9/1983 | Carroll | 363/56 |
| 4,489,373 | 12/1984 | du Parc | 363/56 |
| 4,559,590 | 12/1985 | Davidson | 363/21 |

OTHER PUBLICATIONS

Nazario et al., "Converter Regulation At The Primary", IBM. Tech. Disclosure Bulletin, vol. 27, No. 1A, Jun. 84.

Shaughnessy, "Modelling and Design of Non-Dissipative LC Snubber Networks", Power Con 7, Mar. 1980.

Primary Examiner—Patrick R. Salce
Assistant Examiner—Sterrett
Attorney, Agent, or Firm—Weingarten, Schurgin, Gagnebin & Hayes

[57] ABSTRACT

A pulse absorbing circuit is disclosed for a power source circuit for absorbing an abnormal pulse when an input current at a primary winding of an output transformer in a switching power source is cut off. The pulse absorbing circuit includes a capacitor, one end of which is connected to a secondary winding output terminal of a transformer in a phase opposite to a primary winding input terminal thereof. A first rectifying element is provided, an anode of which is connected to the other end of the capacitor and a cathode of which is connected to an output terminal of a rectifying circuit arranged at a secondary winding side of the transformer. A second rectifying element is provided, a cathode of which is connected to a junction between the first rectifying element and the capacitor. A conductor is inserted between a ground terminal and the second rectifying element. The conductor has, for example, a coil for absorbing and effectively reutilizing abnormal pulse energy.

2 Claims, 6 Drawing Figures

PULSE ABSORPTION CIRCUIT FOR POWER SOURCE CIRCUIT

BACKGROUND OF THE INVENTION (1) Field of the Invention

The present invention relates to a pulse absorption circuit for absorbing an abnormal pulse generated at a secondary winding when an input current is cut off at a primary winding of an output transformer in a switching power source.

(2) Description of the Prior Art

Conventionally, a pulse absorption circuit is arranged in an output transformer of a switching power source. In typical conventional pulse absorption circuits S shown in FIGS. 1 to 4, each circuit S is connected between a ground side terminal $T_1$ of a primary winding of a transformer T and a ground terminal E, i.e., between the collector and emitter of a switching transistor Q. In the arrangement shown in FIG. 1, a snubber comprises a series circuit of a capacitor C and a resistor R. In the arrangement shown in FIG. 2, varistor B is used to constitute a pulse absorption circuit. In the arrangement shown in FIG. 3, a Zener diode Z is used to absorb a pulse component having a voltage exceeding a predetermined voltage. In the arrangement shown in FIG. 4, a clamp circuit is arranged wherein a diode D is connected in series with a capacitor C, and a common junction therebetween is connected to a ground terminal E through a resistor R.

In these conventional pulse absorption circuits, pulse energy is absorbed by a circuit loss, thereby degrading efficiency of the power source.

SUMMARY OF THE INVENTION

It is, therefore, an object of the present invention to provide a pulse absorption circuit for properly absorbing an abnormal pulse and reutilizing absorbed energy, thereby improving efficiency of a power source voltage.

In order to achieve the above object of the present invention, there is provided a pulse absorbing circuit for a power source circuit for absorbing an abnormal pulse when an input current at a primary winding of an output transformer in a switching power source is cut off, comprising: a capacitor, one end of which is connected to a secondary winding output terminal of the transformer in a phase opposite to a primary winding input terminal thereof; a first rectifying element, an anode of which is connected to the other end of said capacitor and a cathode of which is connected to an output terminal of a rectifying circuit arranged at a secondary winding side of said transformer; a second rectifying element, a cathode of which is connected to a junction between said first rectifying element and said capacitor; and a conductor inserted between a ground terminal and said second rectifying element. The conductor comprises, for example, a coil for absorbing the abnormal pulse to effectively reutilize abnormal pulse energy.

DETAILED DESCRIPTION OF THE PREFERRED EMBODIMENTS

A pulse absorption circuit according to an embodiment of the present invention will be described with reference to FIG. 5.

Figure 1:
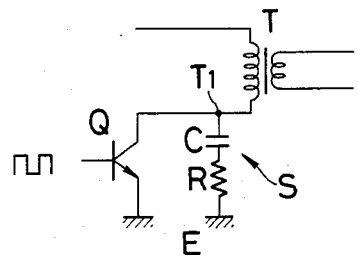
FIGS. 1 to 4 circuit diagrams showing conventional pulse absorption circuits for a power source circuit, respectively.
Figure 4:
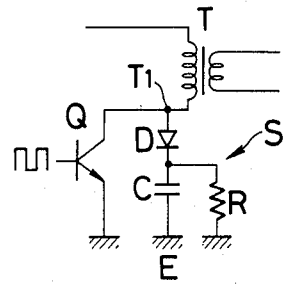
Figure 2:
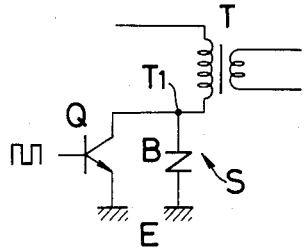
Figure 5:
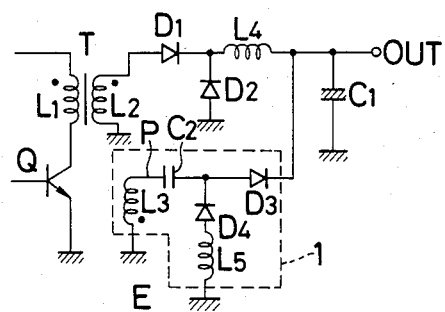
FIG. 5 is a circuit diagram of a pulse absorption circuit for a power source circuit according to an embodiment of the present invention.
Figure 3:
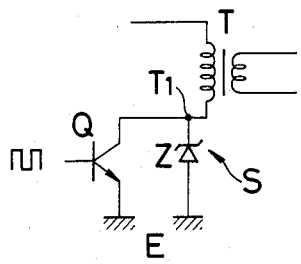

Referring to FIG. 5, reference symbol T denotes a transformer; and Q, a switching transistor for supplying or cutting off a current with respect to a primary winding $L_1$. Reference symbols $L_2$ and $L_3$ denote secondary windings of the transformer T. An output from the secondary winding $L_2$ is rectified and smoothed through a rectifying diode $D_2$, a choke coil $L_4$ and a smoothing capacitor $C_1$. Reference numeral 1 denotes a pulse absorption circuit. The pulse absorption circuit 1 comprises: a capacitor $C_2$, one end of which is connected to a secondary winding output terminal P of the transformer T in a phase opposite to a primary winding input terminal thereof; a diode $D_3$ as a first rectifying element, an anode of which is connected to the other end of the capacitor $C_2$ and a cathode of which is connected to an output terminal OUT of a rectifying circuit arranged at a secondary winding side of the transformer T; a diode $D_4$ as a second rectifying element, a cathode of which is connected to a junction between the diode $D_3$ and the capacitor $C_2$; and a conductor inserted between a ground terminal E and the rectifying element $D_4$. The conductor comprises a coil $L_5$.

The operation of the pulse absorption circuit will be described hereinafter. When an electromotive force is generated at the secondary winding $L_2$ of the transformer T in such a manner that the diode $D_3$ is reverse biased, the capacitor $C_2$ is charged by the electromotive force at the winding $L_3$ through the coil $L_5$ and the diode $D_4$. In this case, the coil $L_5$ is operated to reduce pulse noise by slowly charging the capacitor $C_2$. However, the coil $L_5$ may be omitted. When the coil $L_5$ is omitted, the anode of the diode $D_4$ is directly connected to the ground terminal E. Thereafter, when the polarity of the output voltage at the winding $L_2$ is inverted, the capacitor $C_2$ is discharged through the diode $D_3$ since a voltage of the winding $L_3$ causes the output terminal P to be set at a positive potential. The discharge voltage thus appears at the output terminal OUT. The pulse noise generated at the side of the winding $L_2$ can be absorbed by the capacitor $C_2$. In addition, the pulse noise energy can be effectively utilized to improve efficiency of the power source voltage.

Figure 6:
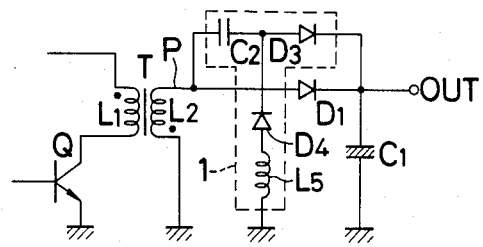
FIG. 6 is a circuit diagram of a pulse absorption circuit for a power source circuit according to another embodiment of the present invention.

FIG. 6 shows another embodiment of the present invention. Only a winding $L_2$ is provided as a secondary winding of a transformer T. In this embodiment, pulse noise energy is supplied to the secondary winding only when a switching transistor Q is turned off. The arrangement of the pulse absorption circuit 1 is the same as that of the previous embodiment (FIG. 5), except that one end of a capacitor $C_2$ is connected to one end (secondary output terminal P having a phase opposite to the primary input terminal) of the winding $L_2$.

When an electromotive force is generated in the winding $L_2$ in such a manner that a diode $D_1$ is reverse biased, the capacitor $C_2$ is charged through a coil $L_5$ and a diode $D_4$. Thereafter, when the polarity of the secondary winding output is inverted upon OFF operation of a transistor Q, a smoothing capacitor $C_1$ is charged through the diode $D_1$. In this case, the charge at the capacitor $C_2$ is supplied to the output terminal OUT through the diode $D_3$. In the same manner as in the first embodiment, the pulse generated at the winding $L_2$ is absorbed by the capacitor $C_2$. In addition, when the transistor Q is on, the energy charged in the capacitor $C_2$ can be effectively utilized.

According to the pulse absorption circuit for a power source circuit of the present invention, the abnormal pulse generated when the input current at the primary winding of the output transformer in the switching power source is cut off can be absorbed at the secondary winding side. In addition, absorbed energy can be effectively utilized to greatly improve the power source voltage.

What is claimed is:

1. A pulse absorption circuit for a switching power source circuit for supplying or cutting off an input current at a primary winding of a transformer upon ON-/OFF operation of a switching element, comprising:

a rectifying circuit having an output terminal, said rectifying circuit including a diode and a smoothing capacitor operatively coupled at a secondary winding side of said transformer for smoothing and rectifying an output of the secondary winding;

a second capacitor, one end of which is connected to a secondary winding output terminal of the transformer in a phase opposite to a primary winding input terminal thereof;

a first rectifying element, an anode of which is connected to the other end of said second capacitor and a cathode of which is connected to said output terminal of said rectifying circuit;

a second rectifying element, a cathode of which is connected to a junction between said first rectifying element and said second capacitor; and a conductor inserted between a ground terminal and said second rectifying element.

2. A pulse absorption circuit according to claim 1, wherein said conductor comprises a coil.

* * * * *